United States Patent
Maltabas et al.

(10) Patent No.: US 11,115,037 B1
(45) Date of Patent: Sep. 7, 2021

(54) SPUR CANCELATION IN PHASE-LOCKED LOOPS USING A RECONFIGURABLE DIGITAL-TO-TIME CONVERTER

(71) Applicant: Apple Inc., Cupertino, CA (US)

(72) Inventors: Samed Maltabas, Santa Clara, CA (US); Boon-Aik Ang, Los Altos, CA (US); Yu Chen, Santa Clara, CA (US); Dennis M. Fischette, Jr., Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/018,968

(22) Filed: Sep. 11, 2020

(51) Int. Cl.
*H03L 7/099* (2006.01)
*H03L 7/197* (2006.01)
*H03L 7/085* (2006.01)
*H03L 7/081* (2006.01)

(52) U.S. Cl.
CPC ............ *H03L 7/0995* (2013.01); *H03L 7/081* (2013.01); *H03L 7/085* (2013.01); *H03L 7/1974* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 7,911,241 B1* | 3/2011 | Zeller | ................... | H03L 7/1976 327/105 |
| 8,907,642 B1* | 12/2014 | Burstein | ............... | H02M 3/158 323/272 |
| 9,231,605 B2 | 1/2016 | Ainspan et al. | | |
| 9,559,704 B1* | 1/2017 | Wong | ..................... | H03L 7/1974 |
| 9,935,640 B1* | 4/2018 | Chan | .................... | H03C 3/0925 |
| 9,954,543 B1* | 4/2018 | Chan | .................... | H03L 7/0995 |
| 9,998,129 B1* | 6/2018 | Zhuang | ................ | H03L 7/0992 |
| 10,090,845 B1 | 10/2018 | Midha et al. | | |
| 10,862,427 B1* | 12/2020 | Chan | .................... | H03B 5/1212 |
| 2003/0179026 A1* | 9/2003 | Alexander | ............ | H03L 7/0814 327/158 |
| 2008/0136475 A1* | 6/2008 | Gomm | .................. | H03L 7/0814 327/158 |
| 2008/0258835 A1* | 10/2008 | Galloway | ............ | H03C 3/0933 332/127 |
| 2010/0327981 A1* | 12/2010 | Yang | ..................... | H03L 7/1976 331/17 |
| 2015/0062202 A1* | 3/2015 | Lu | ......................... | G09G 3/3208 345/691 |
| 2016/0359492 A1* | 12/2016 | Zhang | ................... | H04L 7/0037 |
| 2017/0366376 A1 | 12/2017 | Wang et al. | | |

* cited by examiner

*Primary Examiner* — Adam D Houston
(74) *Attorney, Agent, or Firm* — Kowert, Hood, Munyon, Rankin & Goetzel, P.C.

(57) ABSTRACT

A clock signal generated by a fractional-N phase-locked loop circuit may include deterministic jitter resulting from a sigma-delta modulation of a frequency divisor used by a divider circuit. In order to reduce such jitter, a cancelation circuit is employed that can generate a feedback signal by delaying an output signal from the divider circuit, where the amount of delay applied to the output signal is based on an accumulated phase residue from the modulation of the frequency divisor. The resultant feedback signal is compared to a reference signal, results of which are used to adjust an oscillator circuit generating the clock signal, thereby reducing the deterministic jitter.

20 Claims, 14 Drawing Sheets

SPUR CANCELATION IN PHASE-LOCKED LOOPS USING A RECONFIGURABLE DIGITAL-TO-TIME CONVERTER

BACKGROUND

Technical Field

This disclosure is generally directed to phase-locked loop circuits in computer systems, and more particularly to spur cancelation in fractional-N phase-locked loop circuits.

Description of the Related Art

Computer systems often employ periodic signals (often referred to as "clock signals") to relay timing information to different circuits included in such computer systems. The timing information may be used, for example, by latch or flip-flop circuits to sample and hold data. Additionally, the timing information may be used in sending and receiving data between different circuit blocks within an integrated circuit, or between different integrated circuits.

Clock signals may be generated using a variety of frequency synthesis circuits and techniques. In some cases, a reference clock signal may be generated using a crystal oscillator circuit. Phase-locked loop (PLL) or delayed-locked loop (DLL) circuits may, in turn, be employed to generate other clock signals of differing frequencies and phases relative to the reference clock signal.

In order to generate clock signals with different frequencies than the reference clock signal, some clock generator circuits may employ frequency divider circuits. Such frequency divider circuits divide a frequency of an output clock signal prior to comparing the output clock signal to the reference clock signal. In some cases, the frequency divisor may be an integer while, in other cases, the frequency divisor may include both integer and fractional components. Phase-locked loop circuits that employ a frequency divisor that includes both integer and fractional components are commonly referred to as "fractional-N phase-locked loop circuits."

SUMMARY OF THE EMBODIMENTS

Various embodiments of a fractional-N phase-locked loop circuit are disclosed. Broadly speaking, a fractional-N phase-locked loop circuit includes an oscillator circuit configured to generate an oscillator signal. The fractional-N phase-locked loop circuit also includes a divider circuit configured to generate a plurality of divider output signals using the oscillator signal and a divisor. A frequency of a given one of the divider output signals is a fractional quotient of a frequency of the oscillator signal. The fractional-N phase-locked loop circuit also includes a cancelation circuit configured to generate a feedback signal using a particular divider output signal of the plurality of output divider signals. A delay between the particular divider output signal and the feedback signal is based on an accumulated phase residue generated by the divider circuit. A comparator circuit is configured to compare a reference signal to the feedback signal to generate a control signal that is used, by the oscillator circuit, to adjust the frequency of the oscillator signal. By generating the feedback signal from the output of the divider circuit based on the accumulated phase residue, the phase error introduced in by the frequency division can be reduced, thereby reducing jitter in the oscillator signal.

DETAILED DESCRIPTION OF EMBODIMENTS

Figure 1:
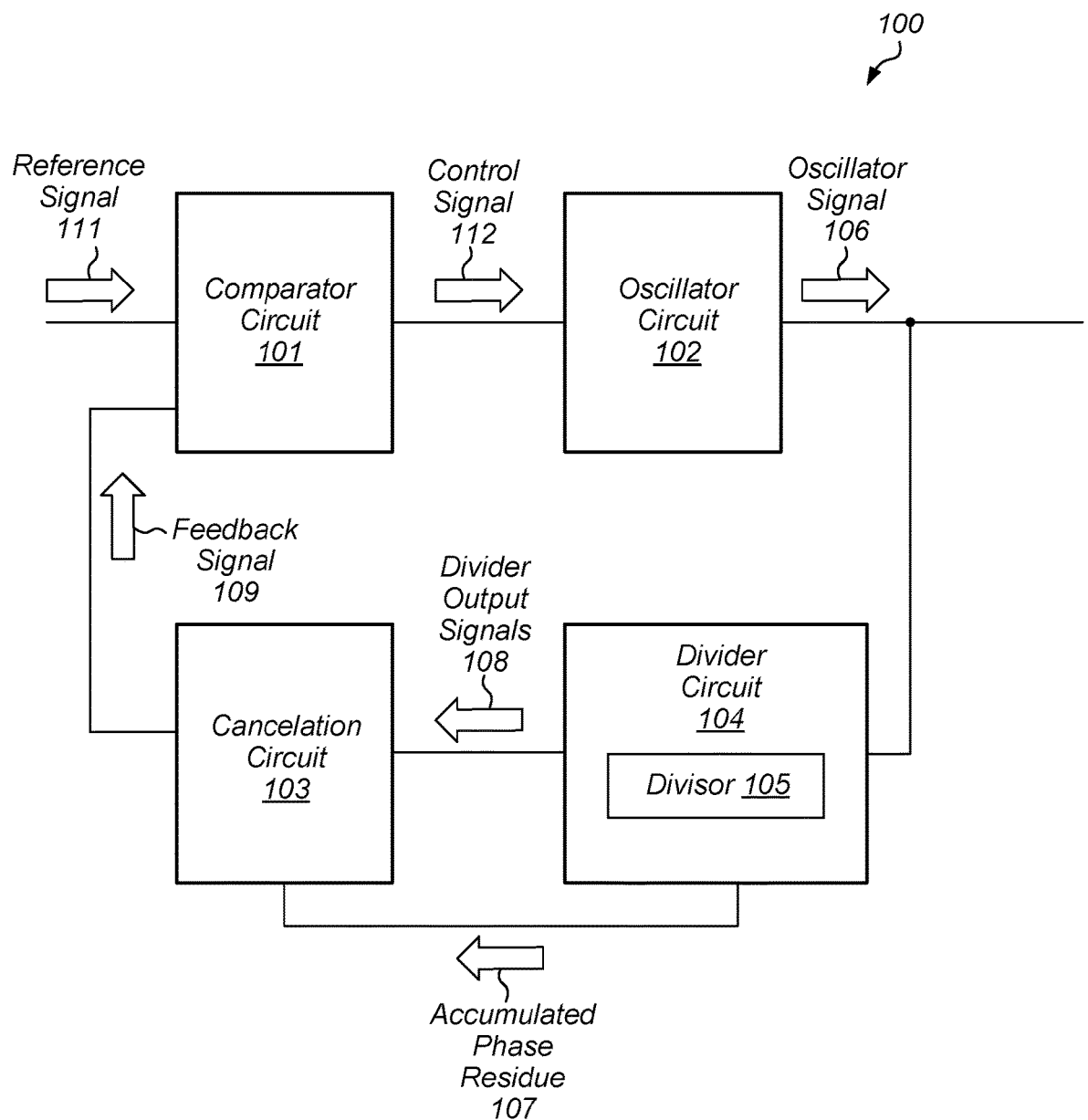
FIG. 1 is a block diagram of an embodiment of a fractional-N phase-locked loop circuit with spur cancelation.

Many computer systems employ clock generator circuits to generate various clock signals to be used as timing references within the computer system by various circuits. Among these clock generator circuits are phase-locked loop circuits (PLLs), which use a reference clock signal (often generated by a crystal oscillator circuit) to generate clock signals with frequencies that are multiples of the reference clock signal frequency. Some circuits in the computer systems use either the rising edge or the falling edge of a clock signal, while other circuits, such as double-data-rate memory devices, use both the rising and falling edges of a clock signal. Duty cycle distortion of a clock signal can adversely affect the performance of circuits that use both edges of the clock signal.

In some cases, it is desirable to generate clock signals that are not integer multiples of a reference signal. Non-integer frequency multiples of the reference signal can be achieved by increasing the frequency resolution of a phase-locked loop circuit. To increase the frequency resolution of a phase-locked loop circuit, divisors with fractional portions may be employed by a frequency divider circuit included in the phase-locked loop circuit. The use of divisors with fractional portions allows for the generation of clock signals that have frequencies that are fractional multiples of a reference signal.

Digital frequency divider circuits are based on counting a number of pulses in an input signal to determine when to transition an output signal. Since it is not possible to count a partial pulse (which would allow fractional divisors), in practice, it is difficult to implement a frequency divider circuit that uses a fractional divisor. Instead, the fractional divisor is approximated by dithering between two integer dividers. A first integer is used to divide a clock signal for a first number of cycles, and a second integer is used to divide the clock signal for a second number of cycles. For example, if a fractional value of 0.1 is desired, then the division ratio is change by 1 every tenth cycle. Alternatively, by changing the division ratio by 1 every one-hundred cycles, a fractional value of 0.01 can be achieved. In some cases, switching between the two divisors may be performed using a sigma-delta modulation scheme.

While generating the desired frequency, on average, dithering between two different divisors results in phase perturbations in the clock signal, causing the phase error to deviate from cycle-to-cycle. Such phase error deviations can result in spur deterministic jitter in the clock signal, that can affect the duty cycle and jitter performance of the clock signal. As noted above, distortion of a clock signal's duty cycle and jitter performance can adversely affect the performance of certain circuits.

In order to reduce the jitter and improve a clock signal's duty cycle, the phase error resulting from switching divisors needs to be canceled. Various techniques have been employed to cancel the phase error. In some cases, the phase error is canceled at the output of a phase comparator circuit included in a phase-locked loop circuit. Such a solution is dependent on the architecture of the phase-locked loop circuit and may impact the phase-locked loop circuit's performance when operating in an integer division mode. Moreover, this type of solution may not be scalable.

Techniques described in the present disclosure, however, use the phase error information with a digital-to-time converter circuit to phase adjust a feedback signal, and cancel the phase error at the input of the phase comparator circuit using the feedback signal which may lead to a greater reduction in jitter reduction. Additionally, such an approach is architecture-independent, and thus can be used with both analog and digital phase-locked loop circuits.

While the aforementioned approach is architecture independent, the inventors have also realized the accuracy of the phase error cancelation depends on how accurately a digital-to-time converter circuit can represent one unit interval associated with the target frequency. As used and defined herein, a "unit interval" refers to a minimum time period between changes in state of a signal. Jitter adds uncertainty to the edges of a clock signal. In some cases, the worst-case jitter of two successive rising edges of a clock signal can reduce the effective period of the clock signal to a minimum value. This minimum value is the unit interval.

A unit interval for a given phase-locked loop varies based on the target frequency of the output clock frequency of the phase-locked loop circuit, power supply voltage level, temperature, and the like. In order to compensate for such variations, a reconfigurable digital-to-time converter circuit is employed that can be calibrated and updated to track a unit interval during operation of the phase-locked loop circuit. Techniques in the present disclosure describe a fractional-N phase-locked loop circuit that cancels phase error introduced by fractional frequency division by adjusting the phase of a feedback signal using a digital-to-time converter circuit. Such a phase cancelation technique allows for accurate cancelation of the phase error, thereby reducing jitter and duty-cycle distortion of the output clock signal.

A block diagram of a fractional-N phase-locked loop circuit with spur cancelation is depicted in FIG. 1. As illustrated, phase-locked loop circuit 100 includes comparator circuit 101, oscillator circuit 102, cancelation circuit 103, and divider circuit 104.

Oscillator circuit 102 is configured to generate oscillator signal 106 using control signal 112. In various embodiments, oscillator circuit 102 may be implemented as a digitally controlled oscillator circuit that includes one or more capacitors that are coupled, based on control signal 112, to internal nodes of oscillator circuit 102 to adjust a frequency of oscillator signal 106. Alternatively, control signal 112 may adjust one or more varactors included in oscillator circuit 102 to adjust the frequency of oscillator signal 106.

Divider circuit 104 may be implemented as a multi-modulus divider circuit that is configured to generate divider output signals 108 using oscillator signal 106 and divisor 105, such that the respective frequencies of the divider output signals 108 are less than the frequency of the oscillator signal 106. In various embodiments, divisor 105 may be a non-integer value, resulting in the respective frequencies of divider output signals 108 being fractional quotients of the frequency of oscillator signal 106. Divider circuit 104 is further configured to generate divider output signals 108 such that there is a phase offset between each of divider output signals 108. In various embodiments, the phase offset corresponds to a unit interval of oscillator signals 106.

In cases of a non-integer divisor, divider circuit 104 is configured to dither the divisor between two integer values in order to achieve division of the frequency of oscillator signal 106 by the non-integer divisor. For example, if a fractional part of divisor 105 is 0.1, then divider circuit 104 will switch between a divisor of N and a divisor N+1 every 10 cycles, where N is an integer portion of divisor 105.

Non-integer divisors are used to increase the frequency resolution of a phase-locked loop. The periodic changing of divisors to achieve a non-integer divisor can generate phase perturbations, which result in spurious signals ("spurs"). Such spurs can contribute to jitter in a clock signal, which reduce the effective usable portion of clock signal in a computer system. As noted above, the phase perturbations can be canceled at the input of comparator circuit 101 to improve the quality of oscillator signal 106. In order to cancel the phase perturbations, divider circuit 104 is also configured to the phase perturbations to generate accumulated phase residue 107.

In order to cancel out the phase perturbations, cancelation circuit 103 makes periodic adjustments to feedback signal 109 that adjust for the phase perturbations introduced by divider circuit 104. Cancelation circuit 103 is configured to generate feedback signal 109 using a particular divider output signal of divider output signals 108. In various embodiments, a delay between the particular divider output signal and the feedback signal 109 is based on accumulated phase residue 107. As described below, cancelation circuit 103 is configured to select the particular divider output signal based on an integer portion of accumulated phase residue 107, and further delay, based on a fractional portion of the accumulated phase residue 107, the particular divider output signal to generate feedback signal 109.

Comparator circuit 101 is configured to compare reference signal 111 to feedback signal 109 to generate a control signal 112. In various embodiments, control signal 112 may be a digital signal that includes multiple bits. Alternatively, control signal 112 may be an analog signal. In some cases, comparator circuit 101 includes a filter circuit configured to filter control signal 112. The filter circuit may be implemented as a digital filter circuit or an analog filter circuit based on the nature of control signal 112.

Figure 2:
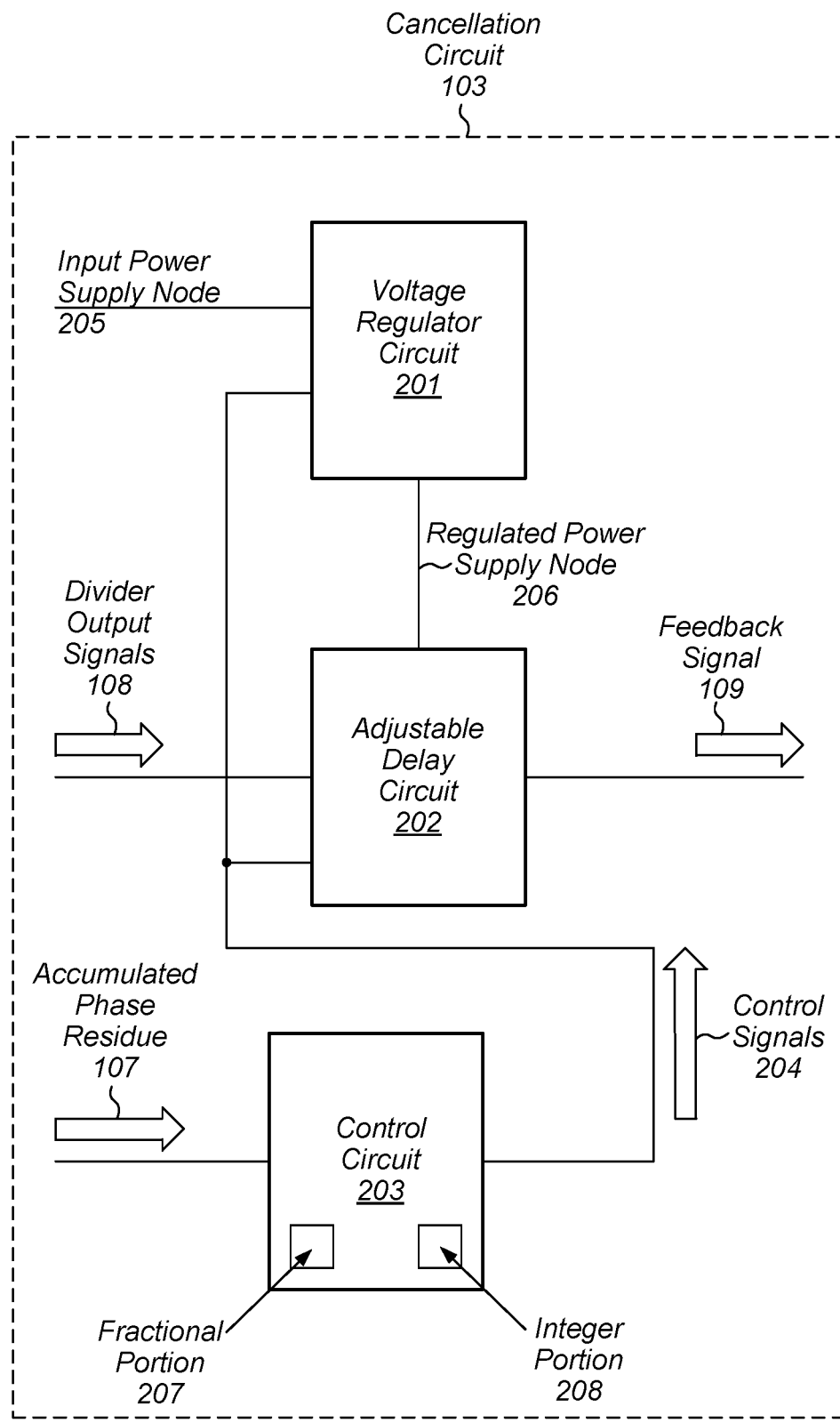
FIG. 2 illustrates a block diagram of an embodiment of a spur cancelation circuit.

A block diagram an embodiment of a cancelation circuit 103 is depicted in FIG. 2. As illustrated, cancelation circuit 103 includes voltage regulator circuit 201, adjustable delay circuit 202, and control circuit 203.

Voltage regulator circuit 201 is configured to generate a particular voltage level on regulated power supply node 206 using control signals 204. As described below, voltage regulator circuit 201 may adjust the voltage level on regulated power supply node based on characterization data. It is noted that by adjusting the voltage level of regulated power supply node 206, a delay generated by adjustable delay circuit 202 may be modified to compensate for environmental or other changes in the electrical characteristics of adjustable delay circuit 202. In various embodiments, voltage regulator circuit 201 may be implemented as a low-dropout (LDO) regulator circuit, or any other suitable voltage regulator circuit.

Control circuit 203 is configured to quantize accumulated phase residue 107 to generate integer portion 208 and fractional portion 207. Control circuit 203 is further configured to generate control signals 204 using fractional portion 207 and integer portion 208. In various embodiments, control signals 204 are used to adjust the voltage level of regulated power supply node 206, and to operate adjustable delay circuit 202. As described below, control circuit 203 may include multiple controllers or state machines, each configured to generate different ones of control signals 204 based on respective constraints.

Adjustable delay circuit 202 performs the function of a digital-to-time converter, taking digital information in the form of accumulated phase residue 107 and converting it to an amount of delay applied to a selected one of divider output signals 108. Adjustable delay circuit 202 is configured to select a particular one of divider output signals 108 based on control signals 204. As described below, the selection of the particular one of divider output signals 108 may be based on integer portion 208. Adjustable delay circuit 202 is further configured to delay the particular one of divider output signals to generate feedback signals 109. In various embodiments, an amount of delay applied to the particular one of divider output signals to generate feedback signal 109 is based on fractional portion 207.

Figure 3:
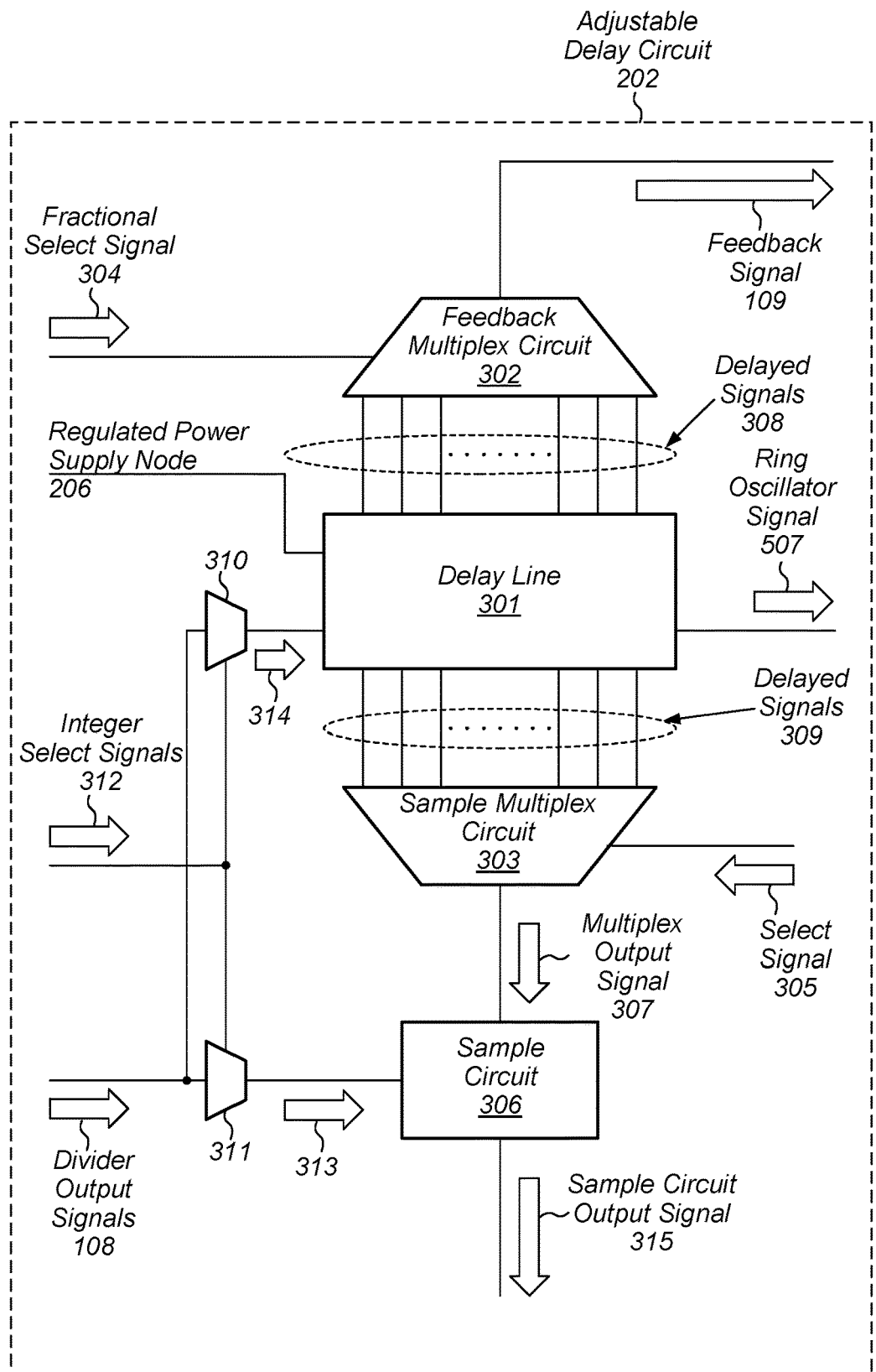
FIG. 3 illustrates a block diagram of an embodiment of an adjustable delay circuit.

A block diagram of an embodiment of adjustable delay circuit 202 is depicted in FIG. 3. As illustrated, adjustable delay circuit 202 includes delay line 301, feedback multiplex circuit 302, sample multiplex circuit 303, sample circuit 306, and multiplex circuits 310 and 311.

As described above, divider circuit 104 generates divider output signals 108. Different ones of divider output signals are used by different circuit blocks within adjustable delay circuit 202. Multiplex circuit 310 is configured to generate signal 314 by selecting a particular one of divider output signals 108 using integer selection signals 312, while multiple circuit 311 is configured to select a different one of divider output signals 108 using integer selection signals 312. It is noted that multiplex circuits 310 and 311 may use different ones of integer selection signals 312. Multiplex circuits 310 and 311 may be implemented using pass gates coupled together in a wired-OR fashion, or any suitable combination of logic gates configured to implement a selection function.

Delay line 301 is configured to generate delayed signals 308 and delayed signals 309 using signal 314 (which is a particular one of divider output signals 108). It is noted that in some cases, delayed signals 309 may be the same as delayed signals 308, or delayed signals 309 may be buffered versions of delayed signals 308. As described below, delay line 301 includes multiple delay stages, each providing a small amount of delay to generate a corresponding one of delay signals 308 and 309. In various embodiments, delay line 301 may be configured to connect an output of a last delay stage to an input of an initial delay stage in order to function as a ring oscillator, generating a ring oscillator signal such as ring oscillator signal 507 described below with reference to FIG. 5.

As illustrated, delay line 301 is coupled to regulated power supply node 206. A voltage level of regulated power supply node 206 may be modified to adjust respective amounts of delay provided by the delay stages included in delay line 301. As described below, a power network may also be included between regulated power supply node 206 and delay line 301 in order to reduce voltage droop on regulated power supply node 206 resulting from the delay stages in delay line 301 switching.

Feedback multiplex circuit 302 is configured to generate feedback signal 109 using delayed signals 308 and fractional select signal 304. In various embodiments, feedback multiplex circuit 302 is configured to select, based on fractional select signal 304, a particular one of delayed signals 308 as feedback signal 109. By selecting the particular one of delayed signals 308, the timing (i.e., delay relative to signal 314) of feedback signal may be adjusted based on fractional portion 207 of accumulated phase residue 107, thereby canceling phase error introduced by divider circuit 104. In various embodiments, feedback multiplex circuit 302 may be implemented as pass gates coupled together in a wired-OR fashion, or any suitable combination of logic gates configured to implement the desired selection algorithm.

During operation, changes in temperature, aging of devices, and the like, may cause the delay provided by the delay stages included in delay line 301 to vary, making it difficult to cancel the phase error introduced by divider circuit 104. To adjust for such variation a form of delay-locked loop circuit is implemented within cancelation circuit 103. To realize the delay-locked loop circuit, sample multiplex circuit 303 selects one of delay signals 309, which is then sampled relative to one of divider output signals 108. Based on a phase relationship between the two signals, the delay provided by one of more of the delay stages in delay line 301 is adjusted, providing a stable delay line for generating feedback signal 109.

Sample multiplex circuit 303 is configured to generate multiplex output signal 307 using select signal 305. In various embodiments, sample multiplex circuit 303 is configured to select a particular one of delayed signals 309 based on select signal 305. As described below, the particular one of delayed signals 309 is sampled, and the results used to fine tune the delay through one or more of the delay stages included in delay line 301. In various embodiments, sample multiplex circuit 303 may be implemented as pass gates coupled together in a wired-OR fashion, or any suitable combination of logic gates configured to implement the desired selection algorithm.

Sample circuit 306 is configured to sample multiplex output signal 307 using signal 313 to generate sample circuit output signal 315. In various embodiments, sample circuit 306 is configured to determine if multiplex output signal 307 is leading or lagging signal 313. Based on whether multiplex output signal 307 is leading or lagging signal 313, the delay through one or more of the delay stages included in delay line 301 is adjusted. Sample circuit 306 may be implemented as a latch circuit, a flip-flop circuit, or any other suitable type of sample-and-hold circuit.

Figure 4:
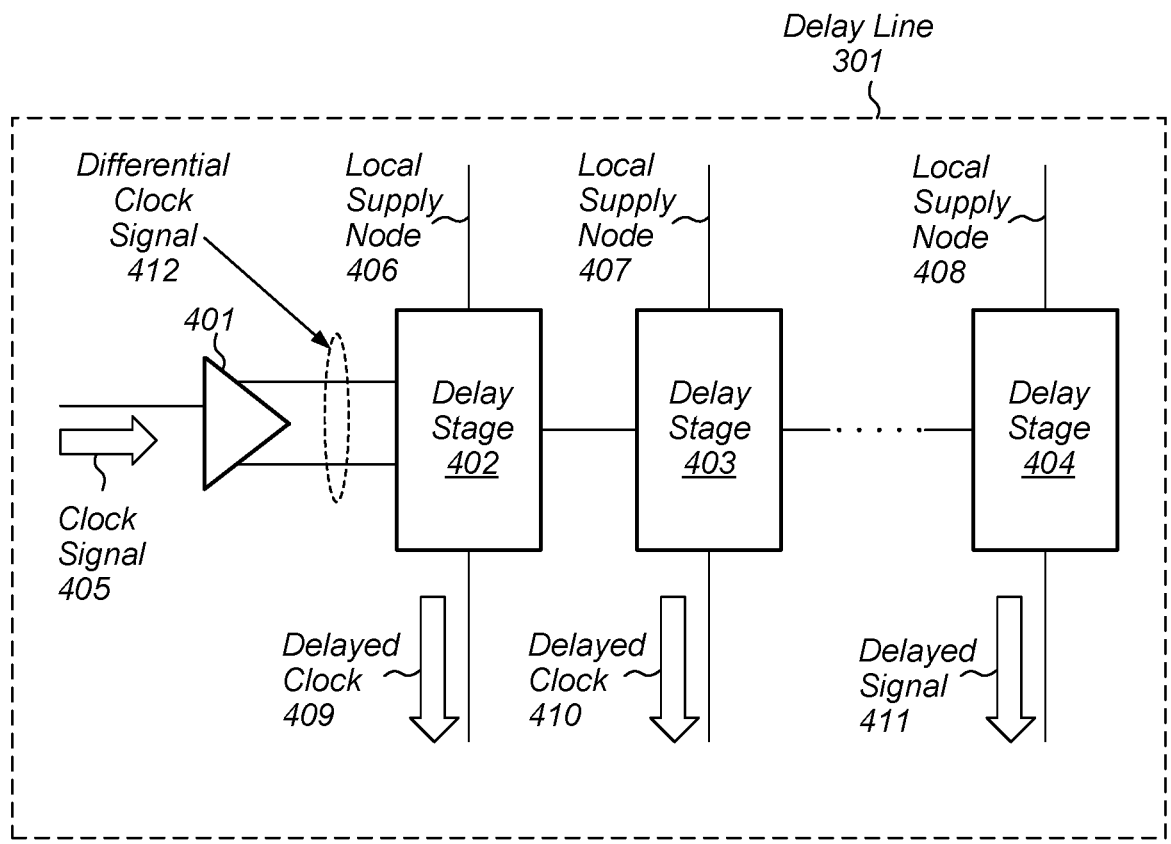
FIG. 4 illustrates a block diagram of an embodiment of a delay line circuit.

Turning to FIG. 4, a block diagram of an embodiment of delay line 301 is depicted. As illustrated, delay line 301 includes driver circuit 401, and delay stages 402-404.

although only three delay stages are depicted in the embodiment of FIG. 4, in other embodiments, any suitable number of delay stages may be employed.

Driver circuit 401 is configured to generate differential clock signal 412 using clock signal 405. In various embodiments, driver circuit 401 may use multiple inverters to both buffer and invert clock signal 405. Driver circuit 401 may, in some embodiments, use a buffered version of clock signal 405 and an inverted version of clock signal 405 to generate differential clock signal 412.

Delay stage 402 is coupled to local supply node 406 and is configured to generate delayed clock signal 409 using differential clock signal 412. In a similar fashion, delay stage 403 is coupled to local supply node 407 and is configured to generate delayed clock 410 using an output of delay stage 403. Delay stage 404 is coupled to local supply node 408 and configured to generate delayed signal 411 using an output of a preceding delay stage. In various embodiments, delayed clock signals 409-411 may correspond to either delayed signals 308 or delayed signals 309.

As described below, delay stages 402-404 may employ inverters, or other suitable inverting amplifier circuits, to generate a desired amount of delay from input to output. In some cases, delay stages 402-404 may employ capacitors which can be coupled (or de-coupled) from respective output of delay stages 402-404 to "fine tune" the delay from input to output.

In some cases, the voltage levels of local supply nodes 406-408 may be substantially the same, i.e., the respective voltage levels are within a threshold value of each other. In other cases, the voltage levels of local supply nodes 406-408 may be different in order to reduce delay variation between different one of delay stages 402-408.

Figure 5:
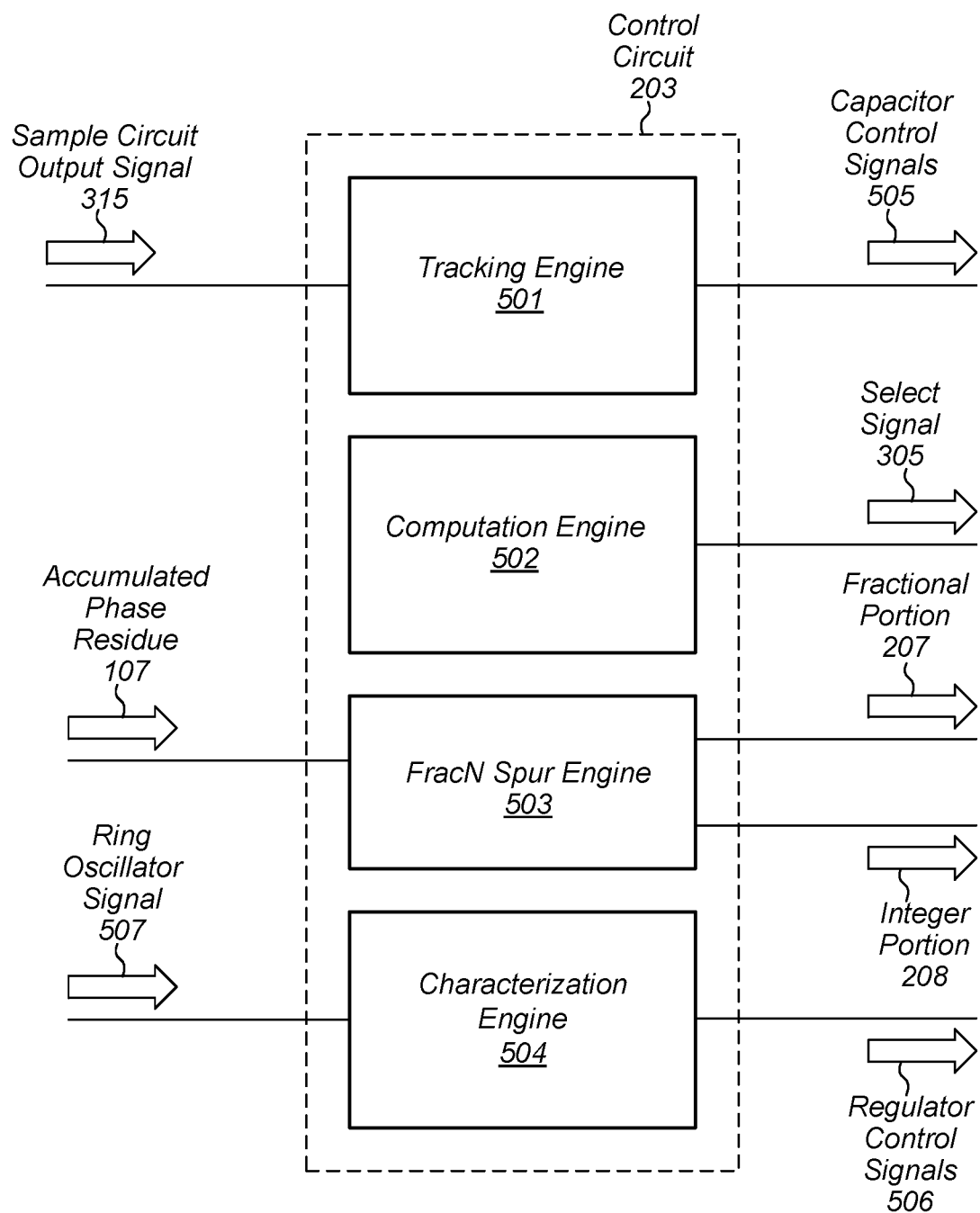
FIG. 5 illustrates a block diagram of an embodiment of a control circuit.

A block diagram of an embodiment of control circuit 203 is depicted in FIG. 5. As illustrated, control circuit 203 includes tracking engine 501, computation engine 502, FracN spur engine 503, and characterization engine 504.

Tracking engine 501 is configured to generate capacitor control signals 505 using sample circuit output signal 315 to track a single unit interval during operation (referred to as "mission mode"). It is noted that capacitor control signals 505 may be included in control signals 204. As described below, capacitor control signals 505 may be used to add or remove capacitance from an output of a delay stage included in delay line 301. As noted above, the loop between tracking engine 501, through delay line 301, to sample circuit output signal 315 forms a delay-locked loop that is used to adjust the delay through delay line 301 to track the single unit interval.

In various embodiments, tracking engine 501 may begin operation after a given time period has elapsed since phase-locked loop circuit 100 has achieved lock. This may occur after an initial power-on event, or after phase-locked loop circuit 100 has been reset. In some cases, tracking engine 501 may be configured to continuously operate until phase-locked loop circuit 100 has been reset of powered off. Tracking engine 501 may, in some embodiments, be implemented as a controller, state machine, or other sequential logic circuit.

Computation engine 502 is configured to generate select signal 305. In various embodiments, computation engine 502 is configured to generate select signal 305 using integer portion 208 and characterization data (e.g., delay per stage) from characterization engine 504. It is noted that select signal 305 may be included in control signals 204. To generate select signal 305, computation engine 502 is configured to determine a number of delay stages included in delay line 301 that represent a single unit interval. Such a determination allows for high re-configurability and allows for any number of delay stages to be used to represent a unit interval. Allowing for different numbers of delay stages to represent a unit interval, increases the granularity of with which phase-locked loop operates over a range of frequencies. Computation engine 502 may, in various embodiments, be implemented as a controller, state machine, or other suitable combination of combinatorial and sequential logic circuits.

FracN spur engine 503 is configured to quantize accumulated phase residue 107 into integer portion 208 and fractional portion 207. In some case, FracN spur engine 503 uses information from computation engine 502 as a global multiplication factor to generate integer portion 208 and fractional portion 207. To quantize accumulated phase residue 107, fracN spur engine 503 may be configured to sample accumulated phase residue 107, and use the resulting samples to generate integer portion 208 and fractional portion 207. FracN spur engine 503 may, in various embodiments, be implemented as a controller, state machine, or other suitable combination of combinatorial and sequential logic circuits.

Characterization engine 504 is configured to generate regulator control signals 506 using ring oscillator signal 507. In various embodiments, regulator control signals 506 may be included in control signals 204. As described above, delay line 301 can be configured to operate as a ring oscillator circuit during a characterization mode to generate ring oscillator signal 507. Characterization engine 504 may be configured to determine a frequency of ring oscillator signal 507, and using the determined frequency, along with the number of delay stages included in delay line 301, determine a delay-per-stage. In some cases, the delay-per-stage value may be used by computation engine 502 to generate select signal 305. Characterization engine 504 may, in various embodiments, be implemented as a controller, state machine, or other suitable combination of combinatorial and sequential logic circuits.

Figure 6:
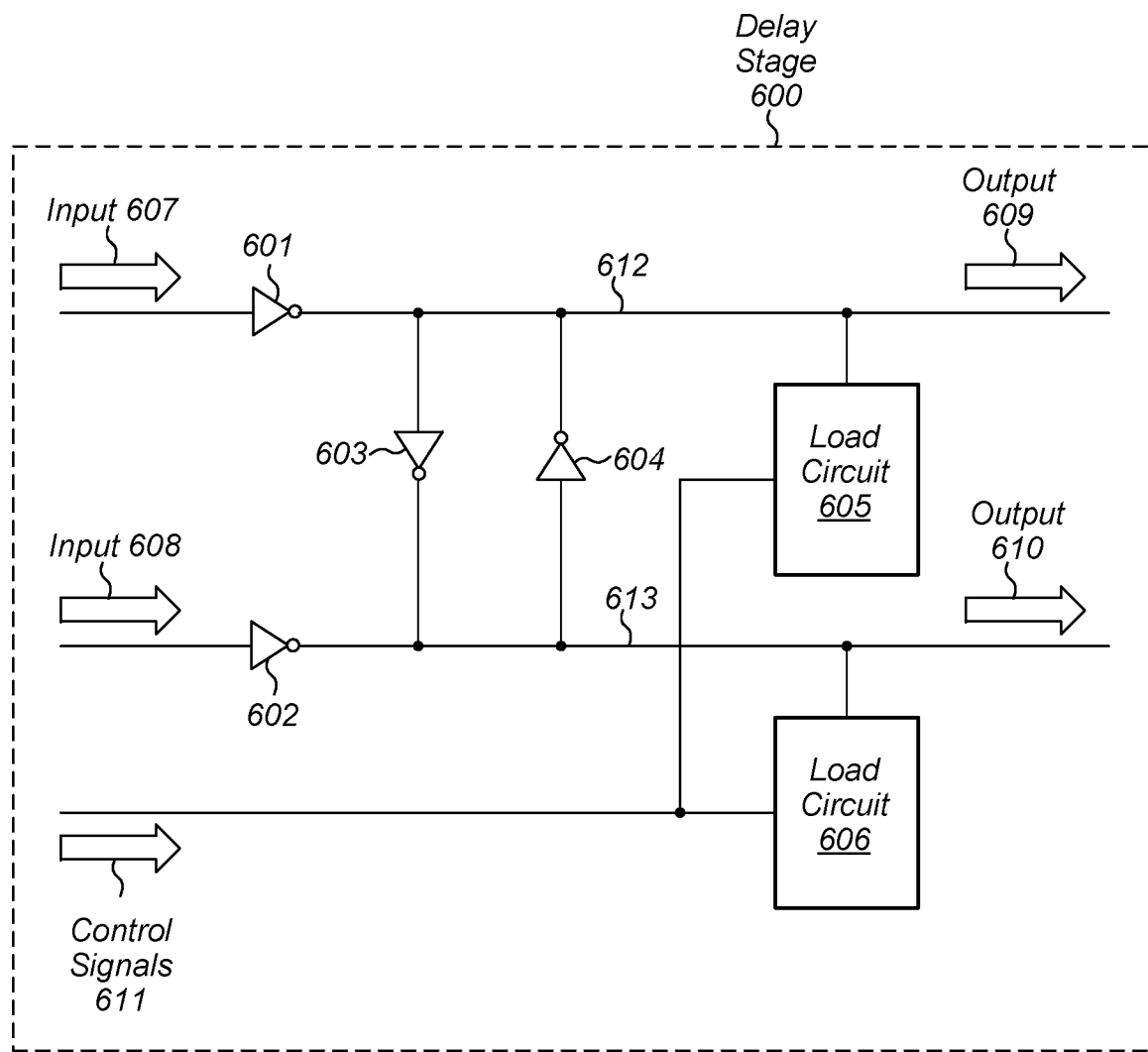
FIG. 6 illustrates a block diagram of a delay stage circuit.

There are numerous circuit techniques to generate a delayed version of a signal. A block diagram of a delay stage using one such technique is depicted in FIG. 6. As illustrated, delay stage 600 includes inverters 601-604, and load circuits 605-606.

Inverters 601 and 602 invert the logical values of input 607 and input 608 to generate output 609 and output 610, respectively. In is noted that input 607 and input 608 may form a differential signal. In a similar fashion, output 609 and output 610 may also form a differential signal.

Inverters 603 and 604 form a cross-coupled pair that is configured to provide regenerating feedback so that transition times from one logic value to another on output 609 and output 610 are reduced. In various embodiments, inverters 601-604 may be implemented as CMOS inverters, or any other suitable circuit configured to generate an output signal with an opposite logical value of its input signal.

As described above, the delay through individual ones of delay stages 402-404 can be adjusted to track environmental changes. This may be accomplished using a variety of techniques. The embodiment depicted in FIG. 6, accomplishes such adjustment by changing the capacitive load on the nodes 612 and 613. Based on control signals 611, load circuits 605 and 606 either increase or decrease the capacitive loads on nodes 612 and 613, respectively. Load circuits 605 and 606 may include multiple capacitors that may be coupled to nodes 612 and 613. Individual ones of the multiple capacitors may be coupled using switches that are controlled by control signals 611. Although control signals 611 is depicted as a single wire, in various embodiments, multiple wires may be employed, and the values of control signals 611 may be encoded to reduce wire count. In such cases, load circuits 605 and 606 may include decoder circuits. In some cases, control signals 611 may be included in capacitor control signals 505.

Voltage regulator circuits typically work well with a static load, and can often have a slow response to transient changes in load current. A delay line, such as those described above, appear as a small load when no signal is traversing the delay line. When an input signal to the delay line transitions, however, as the signal change propagates through the delay line, the switching of delay stages in the delay line generate a large current draw. The large current draw may occur too rapidly for the voltage regulator to respond, resulting in a drop in the regulated voltage level. Since the drop in the regulated voltage level occurs while the delay line is operating, the linearity of the delay line can be affected, impacting the ability of some circuits (e.g., adjustable delay circuit 202) to operate correctly.

Current solutions for correcting the problem include placing a capacitor on the output of the voltage regulator circuit to provide local energy storage and reduce the voltage droop. The capacitor needs to be of sufficient size to reduce the voltage droop to an acceptable level, which can negatively impact the area of the circuit. Alternatively, a steady-state current can be added to maintain the regulated voltage level. The additional current, however, can increase power consumption.

Various embodiments in the present disclosure, however, place the last stage of the delay line closest to the voltage regulator circuit, and employ a power distribution network to introduce a high-voltage drop for the first stage on the delay line and progressively smaller voltage drops for the remaining stages. These embodiments can thus improve the linearity of the delay line, A block diagram of an embodiment of a voltage regulated delay line depicted in FIG. 7. As illustrated, this voltage regulated delay line 700 includes power network 701, delay line 702, and voltage regulator circuit 703. It is noted that in various embodiments, voltage regulator circuit 703 may correspond to voltage regulator circuit 201 as depicted in FIG. 2, and that delay line 702 may correspond to delay line 301 as depicted in FIG. 3.

Voltage regulator circuit 703 is configured to generate a particular voltage level on regulated power supply node 709. In some embodiments, voltage regulator circuit 703 may be configured to adjust the voltage level of regulated power supply node 708 based on one or more control signals (not shown). Voltage regulator circuit 703 may, in various embodiments, be implemented as an LDO regulator circuit, or other suitable voltage regulator circuit.

Power network 701 is configured to generate respective voltage levels on local power supply nodes 707 using a voltage level of regulated power supply node 708. As described below, power network 701, in one embodiment, employs multiple resistors wired in series to generate the desired voltage levels on local power supply nodes 707.

Delay line 702 includes delay stages 704 (denotes as 708A-D) arranged in a serial fashion, with an initial stage 708A coupled to clock signals 706. It is noted that although only four stages are depicted, in other embodiments, any suitable number of stages may be employed. Each of delay stages 708A-D is configured to delay a corresponding input signal to generate a corresponding one of delay signals 705A-D. For example, delay stage 708A generates delay signal 705A using clock signal 706. In a similar fashion, stage 708B generates delay signal 705B using delay signal 705A, and so on.

Delay stage 708D is coupled to regulated power supply node 709. Delay stages 708A-C are coupled to respective ones of local power supply nodes 707. As clock signal 706 transitions, each of delay stages 708A-D switches in sequence, increasing the load current seen by voltage regulator circuit 703. As the load current is drawn through the resistors included in power network 701, the delay generated by the resistors prevents the current from being drawn too quickly, providing more time for voltage regulator circuit 703 to compensate. The change in voltage level of regulated power supply node 709 is thereby reduced, improving the linearity of delay line 702.

Figure 8:
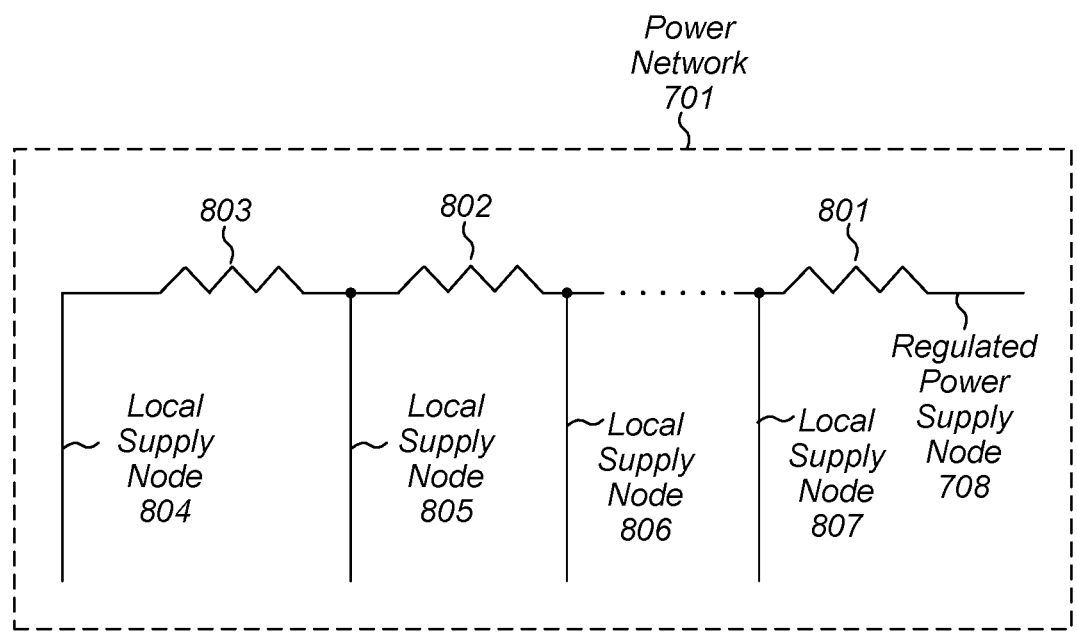
FIG. 8 illustrates a block diagram of an embodiment of a power distribution network.

A block diagram of an embodiment of power network 701 is depicted in FIG. 8. As illustrated, power network 701 includes resistors 801-803. Although three resistors are depicted in the embodiment illustrated in FIG. 8, in other embodiments, any suitable number of resistors may be employed. In some cases, a number of resistors included in power network 701 may correspond to a number of delay stages included in delay line 301.

Figure 7:
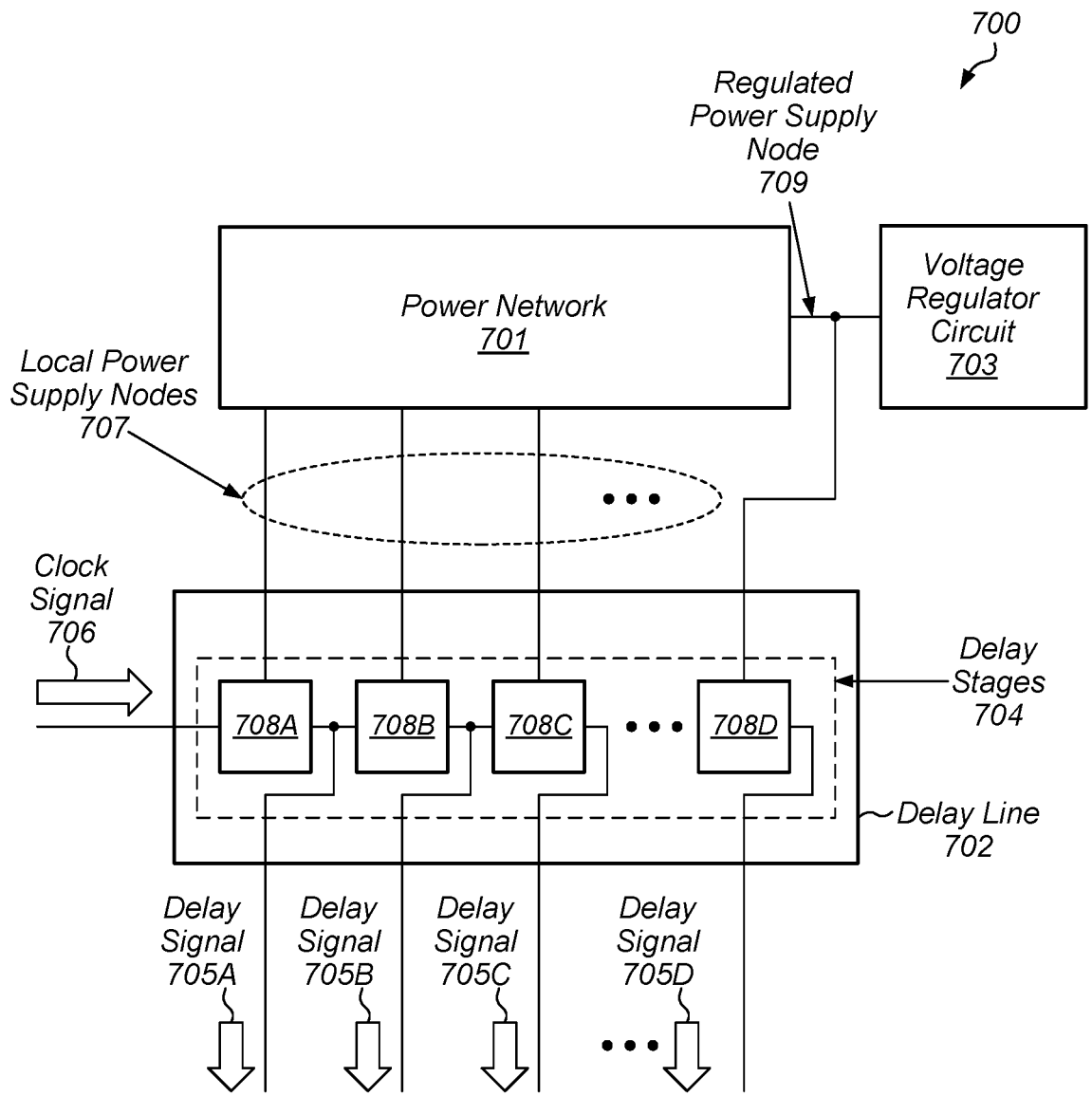
FIG. 7 illustrates a block diagram of an embodiment of a voltage-regulated delay line circuit.

Resistor 801 is coupled between regulated power supply node 708 and local supply node 806. In a similar fashion resistor 802 is coupled between local supply node 805 and 806, while resistors 803 is coupled between local supply nodes 804 and 805. It is noted that local supply nodes 804-807 may be included in local power supply node 707 as depicted in FIG. 7. In various embodiments, resistors 801-803 may be implemented as metal resistors, polysilicon resistors, or any type of resistor available on a semiconductor manufacturing process. It is noted that in some embodiments, resistors 801-803 may each have the same resistance value, while, in other embodiments, each of resistors 801-803 may have different resistance values.

As current is drawn by delay stages 708A-708D via corresponding ones of local supply nodes 804-807, a voltage drop will develop across resistors 801-803, resulting in different voltage levels on local supply nodes 804-807. Starting from regulated power supply node 708, a voltage level of a given local supply nodes 804-807 may be less than preceding ones of local supply nodes 804-807. As described above, by reducing the respective voltage levels of local supply nodes 804-807, the voltage variation across delay stages 708A-708D can be reduced, thereby reducing variation in the delay between any adjacent ones of delay signals 705A-705D.

Figure 9:
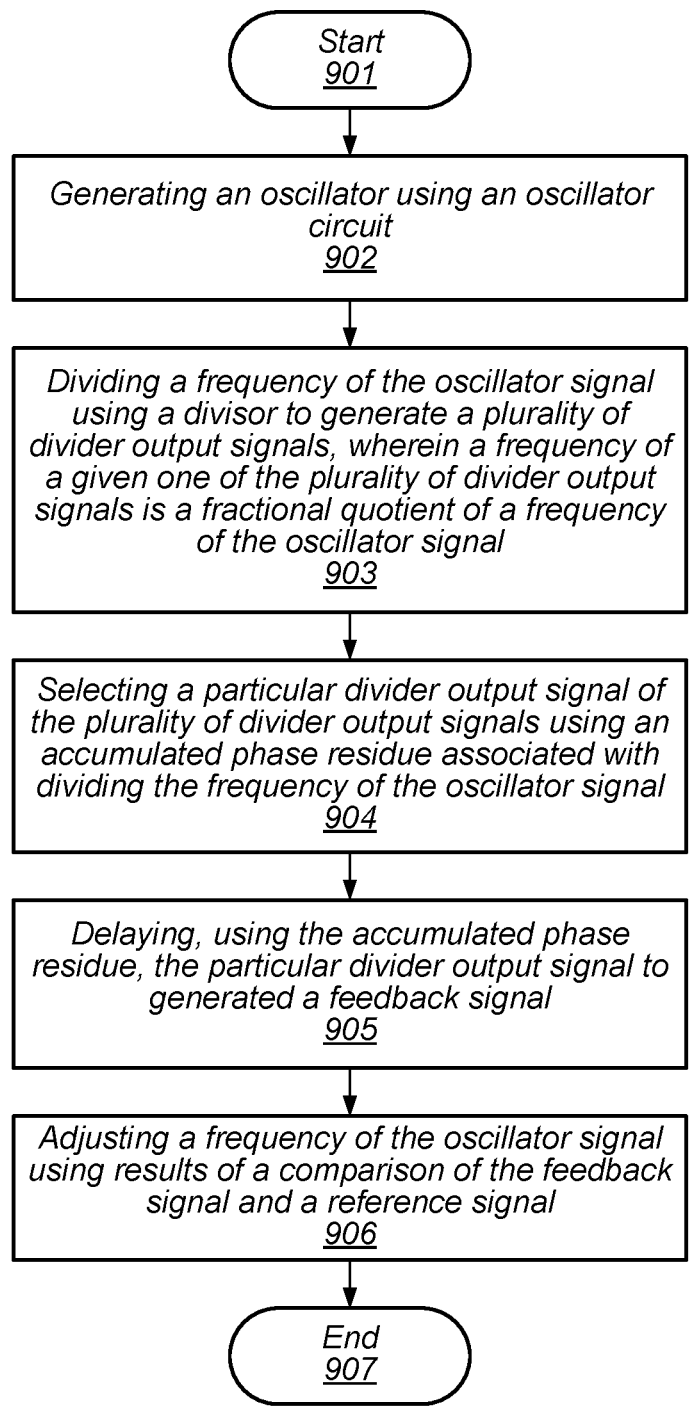
FIG. 9 illustrates a flow diagram depicting an embodiment of a method for operating a fractional-N phase-locked loop circuit with spur cancelation.

Turning to FIG. 9, a flow diagram depicting an embodiment of a method for operating a fractional-N phase-locked loop circuit with spur cancelation is illustrated. The method, which may be applied to phase-locked loop circuit 100, begins in block 901.

The method includes generating an oscillator signal using an oscillator circuit (block 902). In various embodiments, the oscillator signal may be implemented as a digitally controlled oscillator circuit that includes one of more adjustable capacitor banks, and or varactors.

The method further includes dividing a frequency of the oscillator signal using a divisor to generate a plurality of divider output signals, wherein a frequency of a given one of the plurality of divider output signals is a fractional quotient of a frequency of the oscillator signals (block 903).

The method also includes selecting a particular divider output signal of the plurality of divider output signals using an accumulated phase residue associated with dividing the frequency of the oscillator signal (block 904). In some embodiments, the method further may include quantizing the accumulated phase residue into an integer portion and a fractional portion, and selecting the particular divider output signals using the integer portion. An amount of delay between the particular divider output signal and the feedback signal may, in various embodiments, be based on the fractional portion.

The method further includes delaying, using the accumulated phase residue, the particular divider output signal to generate a feedback signal (block 905). In some embodiments, delaying the particular divider output signal includes generating, using an adjustable delay circuit, a plurality of delayed versions of the particular divider output signal, and selecting, based on the fractional portion, a particular one of the plurality of delayed versions of the particular divider output signal to generate the feedback signal.

The method may further include tracking environmental changes of the adjustable delay circuit. In some embodiments, the environmental changes may include changes in temperature, changes in power supply voltage level, and the like. The method may also include adjusting an operational parameter of the adjustable delay circuit based on the environmental changes. In some cases, the operational parameter may include delay value associated with a delay stage included in the adjustable delay circuit.

The method may further include characterizing the adjustable delay circuit to generate characterization data, and adjusting a voltage level of a power supply node coupled to the adjustable delay circuit based on the characterization data. In some embodiments, the adjustable delay circuit includes delay line that includes a plurality of delay stages, and characterizing the adjustable delay circuit includes connecting the delay line as a ring oscillator and measuring a frequency of the ring oscillator, and determining a delay value associated with a given one of the plurality of delay stages. The method may further include determining a number of delay stages whose delay corresponds to a unit interval of the reference signal.

The method also includes adjusting a frequency of the oscillator signal using results of a comparison of the feedback signal and a reference signal (block 906). In some cases, adjusting the frequency of the oscillator signal includes adjusting a value of one or more capacitors coupled to internal node of the oscillator signal. The method concludes in block 907.

Figure 10:
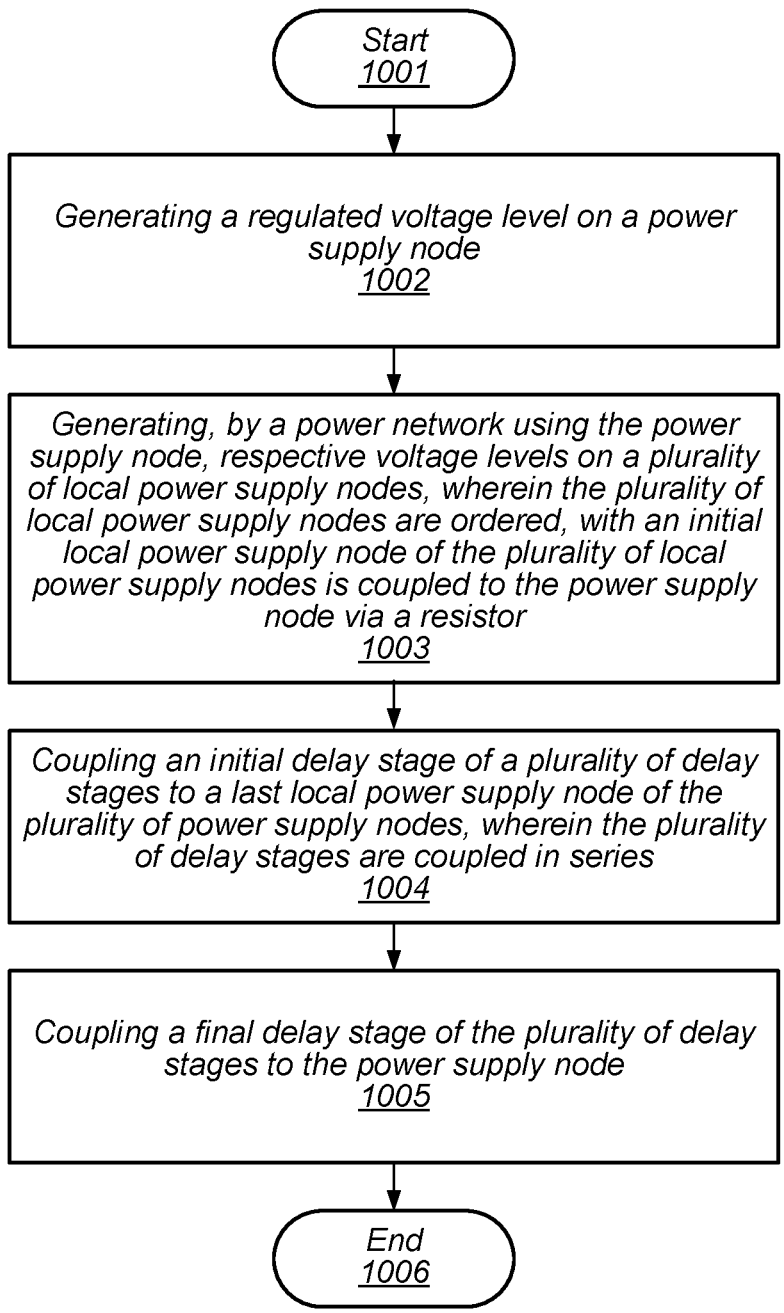
FIG. 10 illustrates a flow diagram depicting an embodiment of a method for reducing voltage drop across a delay line.

Turning to FIG. 10, a flow diagram depicting an embodiment of a method for reducing voltage drop across a delay line is depicted. The method, which may be applied to voltage regulated delay line 700, begins in block 1001.

The method includes generating a regulated voltage level on a power supply node (block 1002). In various embodiments, generating the regulated voltage level includes adjusting the regulated voltage level based on one or more environmental conditions or operating parameters of a load circuit. In some cases, generating the regulated voltage level may be performed by a low-dropout voltage regulator circuit, or any other suitable type of voltage regulator circuit.

The method further includes generating, by a power network using the power supply node, respective voltage levels on a plurality of local power supply nodes, where the plurality of local power supply nodes are ordered, with an initial local power supply node of the plurality of local power supply nodes is coupled to the power supply node via a resistor (block 1003). As described above, the power network may include a series of resistors configured to drop respective voltages in order to generate the respective voltage levels on the plurality of local power supply nodes.

The method also includes coupling an initial delay stage of a plurality of delay stages to a last local power supply node of the plurality of local power supply nodes, where the plurality of delay stages are coupled in series (block 1004). The method may also include receiving by the initial delay stage an input signal, and generating by the plurality of delay stages a plurality of delayed output signals using the input signal. The method further includes coupling a final delay stage of the plurality of delay stages to the power supply node (block 1005). The method concludes in block 1006.

Figure 11:
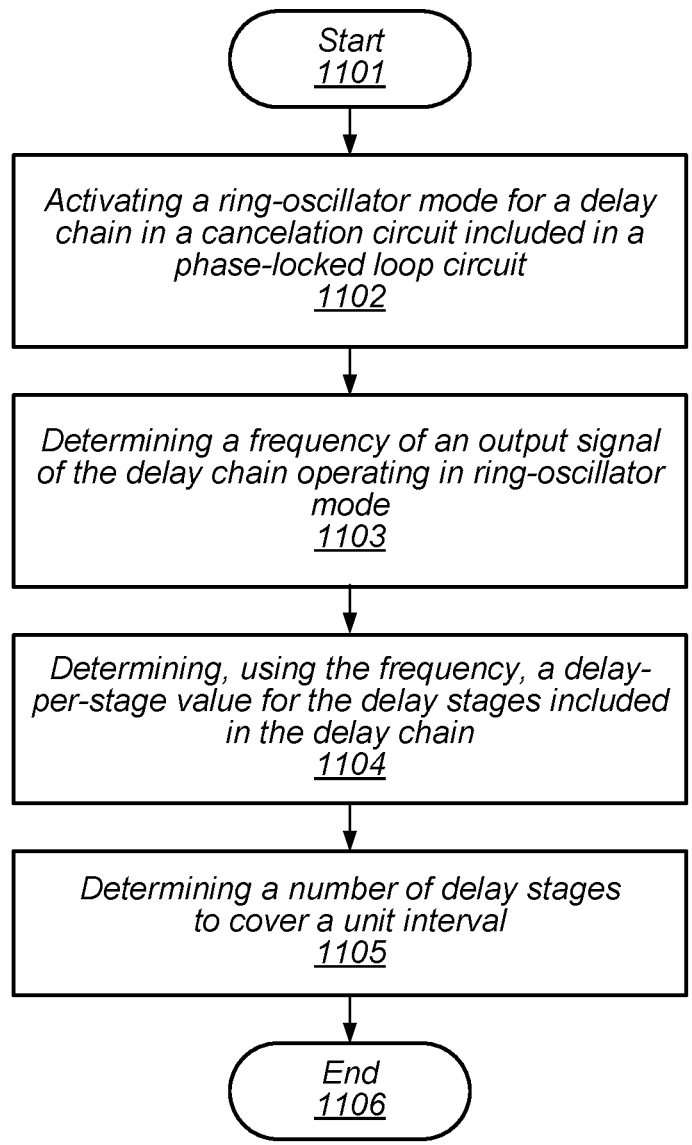
FIG. 11 illustrates a flow diagram depicting an embodiment of a method for performing a characterization routine for a fractional-N phase-locked loop circuit.

As described above, periodic characterization of circuit blocks within cancelation circuit 103 are performed. Such characterization allows cancelation circuit 103 to compensate for changes (e.g., device wear) that occur in the circuit blocks over time. A flow diagram depicting an embodiment of a method for performing a characterization routine for a fractional-N phase-locked loop circuit is illustrated in FIG. 11. The method, which may be applied to phase-locked loop circuit 100, begins in block 1101.

The method includes activating a ring-oscillator mode for a delay chain in a cancelation circuit included in a phase-locked loop circuit (block 1102). In various embodiments, activating the ring-oscillator mode may include coupling an output of the delay chain to an input of the delay chain. In some cases, activating the ring-oscillator mode may be in response to a reset signal received by the phase-locked loop circuit, an initialization or power-on event, or any other suitable stimulus.

The method also includes determining a frequency of an output signal of the delay chain operating in the ring-oscillator mode (block 1103). In various embodiments, determining the frequency may include coupling a number of cycles of the output signal over a particular period of time. The method may also include dividing the number of cycles by the particular period of time to determine the frequency.

The method further includes determining, using the frequency, a delay-per-stage value for delay stages included in the delay chain (block 1104). In various embodiments, determining the delay-per-stage value may include determining a period of the output signal using the frequency, and dividing the period of the output signal by a number of delay stage included in the delay chain.

The method further includes determining a number of delay stages to cover a unit interval (block 1105). In some embodiments, determining the number of delay stages to cover the unit interval may include dividing a period of time associated with the unit interval by the delay-per-stage value. The method concludes in block 1106.

Figure 12:
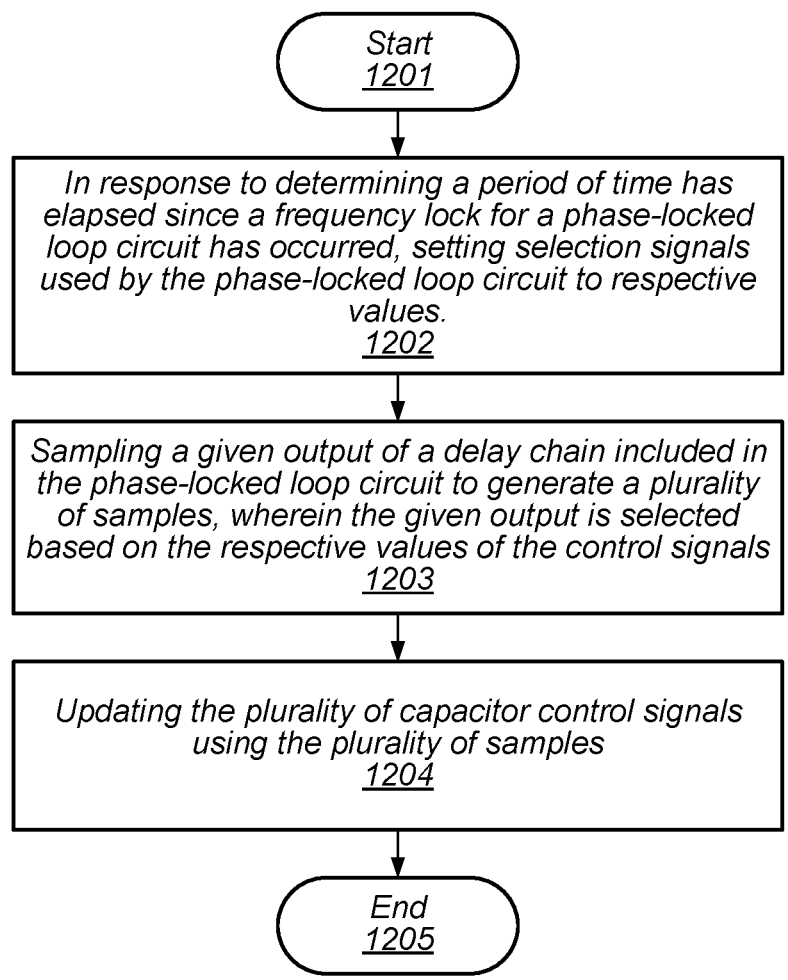
FIG. 12 illustrates a flow diagram depicting an embodiment of a method for tracking environmental changes in a fractional-N phase-locked loop circuit.

As noted above, cancelation circuit 103 may track environmental changes (e.g., temperature changes) and adjust the delay value of one or more delay stages in a delay chain based on the environmental changes. A flow diagram depicting an embodiment of a method for tracking environmental changes in a fractional-N phase-locked loop circuit is illustrated in FIG. 12. The method, which may be applied to phase-locked loop circuit 100, begins in block 1201.

The method includes, in response to determining a period of time has elapsed since a frequency lock for a phase-locked loop circuit has occurred, setting selection signals used by the phase-locked loop circuit to respective values (block 1202). In various embodiments, the selection signal controls which delay signal, of multiple delay signals generated by a delay line, is coupled to a sample circuit. In some cases, setting the selection signals including fixing the selection signals at their respective current values.

The method also includes sampling a given output of a delay chain included in the phase-locked loop circuit to generate a plurality of samples, wherein the given output is selected based on the respective values of the control signals (block 1203). In various embodiments, sampling the given output may include determining a logic value for the given output using a particular edge of a feedback signal generated by a divider circuit included in the phase-locked loop circuit to generate a given value of the plurality of values. In some cases, the method may include averaging the values of the plurality of samples to generate an average value.

The method further includes updating capacitor control signals using the plurality of samples (block 1204). In various embodiments, updating the capacitor control signals may include changing respective values of the capacitor control signals to increase an amount of capacitance used by the delay stages, in response to determining that the given output is leading the feedback signal. Alternatively, updating the capacitor control signals may include changing the respective values of the capacitor control signals to decrease the amount of capacitance used by the delay stages, in response to determining that the given output is lagging the feedback signal. It is noted that the steps described in blocks 1202-1204 may be repeated in a loop until changes in the capacitor control signals from one iteration of the loop to the next as less than a threshold value. The method concludes in block 1205.

Figure 13:
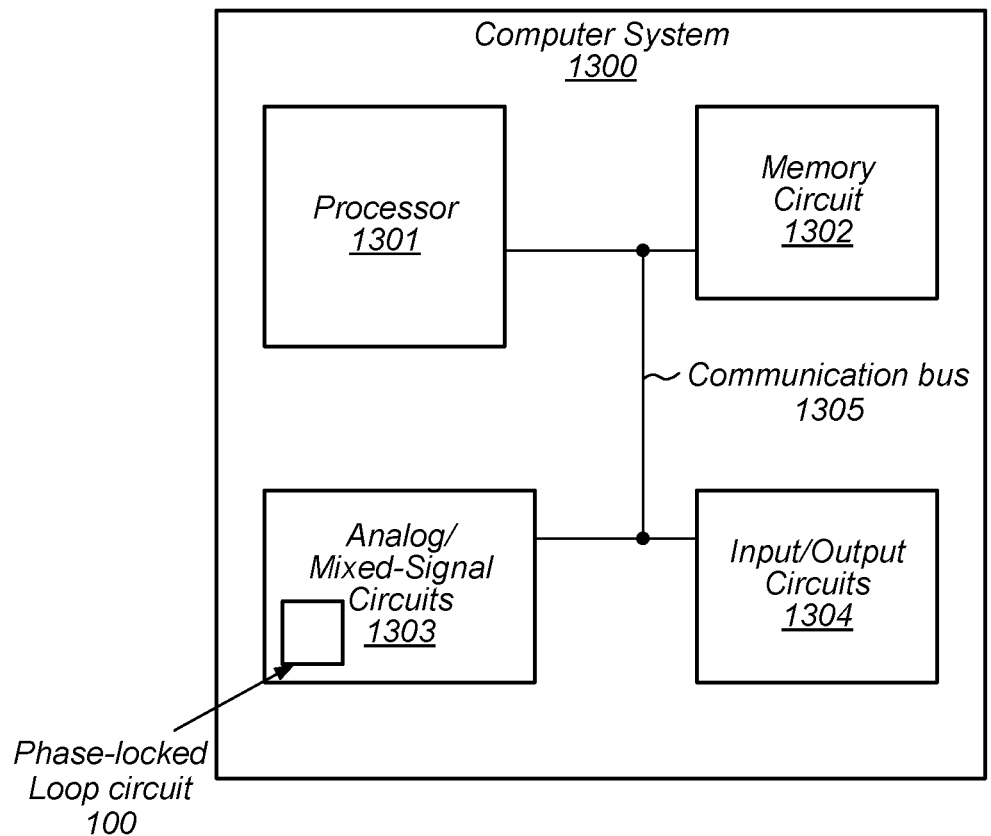
FIG. 13 is a block diagram of an embodiment of a system-on-a-chip that includes a fractional-N phase-locked loop circuit.

A block diagram of system-on-a-chip (SoC) is illustrated in FIG. 13. As illustrated embodiment, the SoC 1300 includes processor circuit 1301, memory circuit 1302, analog/mixed-signal circuits 1303, and input/output circuits 1304, each of which is coupled to communication bus 1305. In various embodiments, SoC 1300 may be configured for use in a desktop computer, server, or in a mobile computing application such as, a tablet, laptop computer, or wearable computing device.

Processor circuit 1301 may, in various embodiments, be representative of a general-purpose processor that performs computational operations. For example, processor circuit 1301 may be a central processing unit (CPU), a graphics processing unit (GPU), a microcontroller, or the like, and may be implemented as an application-specific integrated circuit (ASIC), a field-programmable gate array (FPGA), etc. In some embodiments, processor circuit 1301 may interface to memory circuit 1302, analog/mixed-signal circuits 1303, and input/output circuits 1304 via communication bus 1305.

Memory circuit 1302 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 13, a single memory circuit is depicted. In other embodiments, any suitable number of memory circuits may be employed.

Analog/mixed-signal circuits 1303 includes a variety of circuits including phase-locked loop circuit 100 as depicted in FIG. 1. Additionally, analog/mixed-signal circuits 1303 may include a crystal oscillator circuit, an analog-to-digital converter (ADC) circuit, and a digital-to-analog converter (DAC) circuit (all not shown). In other embodiments, analog/mixed-signal circuits 1303 may be configured to perform power management tasks with the inclusion of on-chip power supplies and voltage regulators.

Input/output circuits 1304 may be configured to coordinate data transfer between SoC 1300 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1304 may be configured to implement a version of Universal Serial Bus (USB) protocol or IEEE 1394 (Firewire®) protocol.

Input/output circuits 1304 may also be configured to coordinate data transfer between SoC 1300 and one or more devices (e.g., other computing systems or integrated circuits) coupled to SoC 1300 via a network. In one embodiment, input/output circuits 1304 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1304 may be configured to implement multiple discrete network interface ports.

Figure 14:
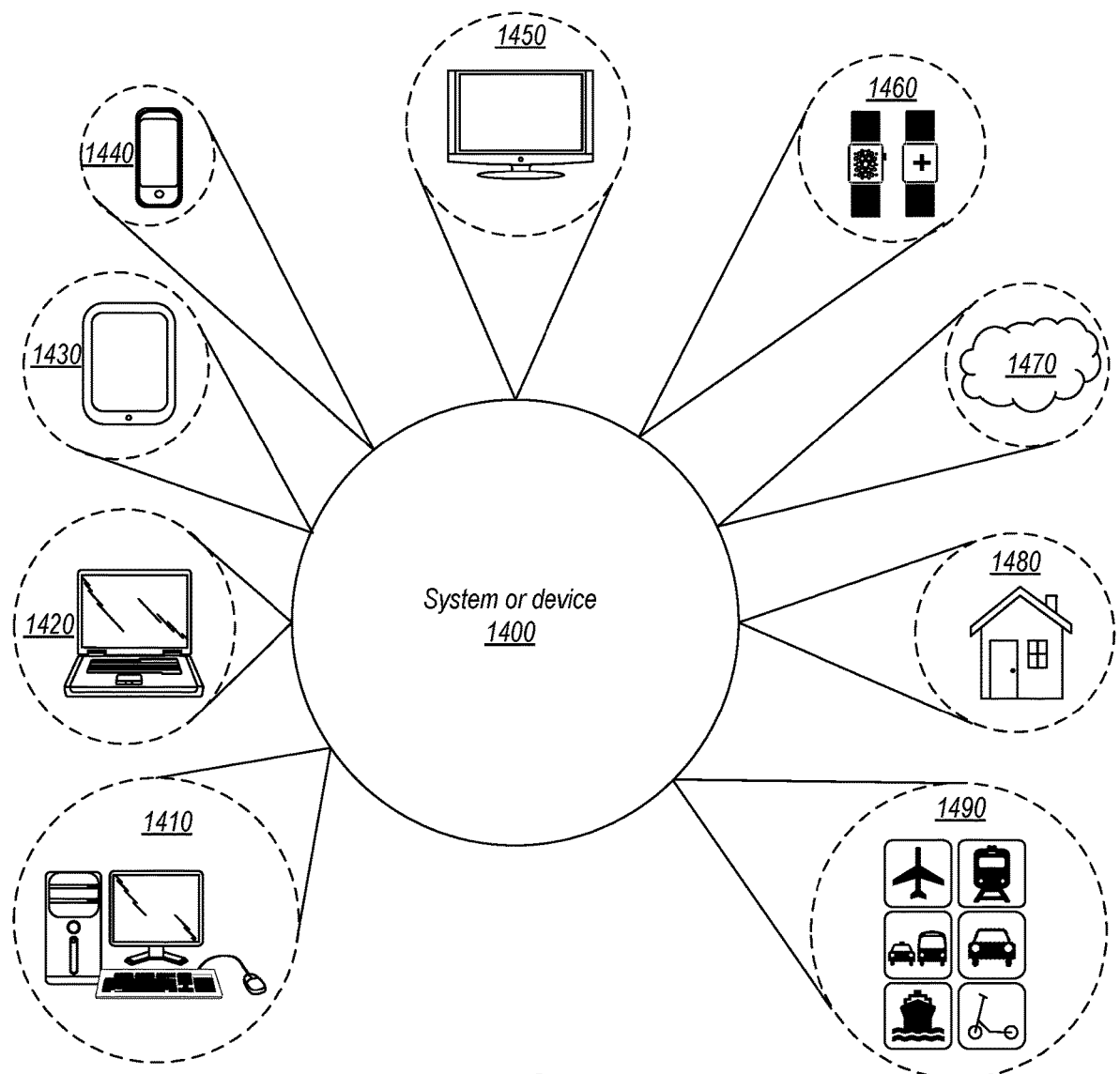
FIG. 14 is a block diagram of a computer system.

Turning now to FIG. 14, various types of systems that may include any of the circuits, devices, or system discussed above are illustrated. System or device 1400, which may incorporate or otherwise utilize one or more of the techniques described herein, may be utilized in a wide range of areas. For example, system or device 1400 may be utilized as part of the hardware of systems such as a desktop computer 1410, laptop computer 1420, tablet computer 1430, cellular or mobile phone 1440, or television 1450 (or set-top box coupled to a television).

Similarly, disclosed elements may be utilized in a wearable device 1460, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1400 may also be used in various other contexts. For example, system or device 1400 may be utilized in the context of a server computer system, such as a dedicated server or on shared hardware that implements a cloud-based service 1470. Still further, system or device 1400 may be implemented in a wide range of specialized everyday devices, including devices 1480 commonly found in the home such as refrigerators, thermostats, security cameras, etc. The interconnection of such devices is often referred to as the "Internet of Things" (IoT). Elements may also be implemented in various modes of transportation. For example, system or device 1400 could be employed in the control systems, guidance systems, entertainment systems, etc. of various types of vehicles 1490.

The applications illustrated in FIG. 14 are merely exemplary and are not intended to limit the potential future applications of disclosed systems or devices. Other example applications include, without limitation: portable gaming devices, music players, data storage devices, unmanned aerial vehicles, etc.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such as "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of elements. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
an oscillator circuit configured to generate an oscillator signal;
a divider circuit configured to generate a plurality of divider output signals using the oscillator signal and a divisor, wherein a frequency of a given one of the plurality of divider output signals is a fractional quotient of a frequency of the oscillator signal;
a cancelation circuit configured to generate a feedback signal using a particular divider output signal, wherein a delay between the particular divider output signal and the feedback signal is based on an accumulated phase residue generated by the divider circuit; and
a comparator circuit configured to compare a reference signal to the feedback signal to generate a control signal; and
wherein the oscillator circuit is further configured to adjust the frequency of the oscillator signal using the control signal.

2. The apparatus of claim 1, wherein the cancelation circuit is further configured to quantize the accumulated phase residue into an integer portion and a fractional portion.

3. The apparatus of claim 2, wherein the cancelation circuit is further configured to select the particular divider output signal of the plurality of divider output signals using the integer portion.

4. The apparatus of claim 2, wherein the cancelation circuit is further configured to delay, based on the fractional portion, the particular divider output signal to generate the feedback signal.

5. The apparatus of claim 4, wherein to delay the particular divider output signal, the cancelation circuit is further configured to adjust, using characterization information, an amount of delay applied to the particular divider output signal.

6. The apparatus of claim 4, wherein to delay the particular divider output signal, the cancelation circuit is further configured to adjust an amount of delay applied to the particular divider output signal based on changes in operating parameters of the cancelation circuit.

7. A method, comprising:
generating an oscillator signal by an oscillator circuit;
dividing a frequency of the oscillator signal using a divisor to generate a plurality of divider output signals, wherein a frequency of a given one of the plurality of divider output signals is a fractional quotient of a frequency of the oscillator signal;
selecting a particular divider output signal of the plurality of divider output signals using an accumulated phase residue associated with dividing the frequency of the oscillator signal;
delaying, using the accumulated phase residue, the particular divider output signal to generate a feedback signal; and
adjusting a frequency of the oscillator signal using results of a comparison of the feedback signal and a reference signal.

8. The method of claim 7, further comprising:
quantizing the accumulated phase residue into an integer portion and a fractional portion;
selecting the particular divider output signal using the integer portion; and
wherein an amount of delay between the particular divider output signal and the feedback signal is based on the fractional portion.

9. The method of claim 8, wherein delaying the particular divider output signal includes:
generating, using an adjustable delay circuit, a plurality of delayed versions of the particular divider output signal; and
selecting, based on the fractional portion, a particular one of the plurality of delayed versions of the particular divider output signal to generate the feedback signal.

10. The method of claim 9, further comprising:
tracking environmental changes of the adjustable delay circuit; and
adjusting an operational parameter of the adjustable delay circuit based on the environmental changes.

11. The method of claim 9, further comprising characterizing the adjustable delay circuit to generate characterization data, and adjusting a voltage level of a power supply node coupled to the adjustable delay circuit based on the characterization data.

12. The method of claim 11, wherein the adjustable delay circuit includes a plurality of delay stages, and wherein characterizing the adjustable delay circuit includes determining a delay value associated with a given one of the plurality of delay stages.

13. The method of claim 12, further comprising determining a number of delay stages whose delay corresponds to a unit interval of the reference signal.

14. An apparatus, comprising:
a voltage regulator circuit configured to generate a particular voltage level on a regulated power supply node;
a power delivery network including a plurality of resistors, wherein the power delivery network is coupled to the regulated power supply node and configured to generate, using a voltage level of the regulated power supply node, a plurality of local power supply signals on corresponding ones of a plurality of local supply nodes, wherein two adjacent local supply nodes of the plurality of local supply nodes are isolated from one another by a particular resistor of the plurality of resistors; and
a delay line circuit including a plurality of delay stages coupled together in a serial fashion, wherein the delay line circuit is configured to delay an input signal to generate a plurality of delayed signals, wherein the plurality of delay stages is coupled to corresponding ones of the plurality of local supply node, and wherein an initial delay stage is coupled to the input signal, and a last delay stage is coupled to the regulated power supply node.

15. The apparatus of claim 14, further comprising:
an oscillator circuit configured to generate a clock signal;
a divider circuit configured to generate a plurality of divider output signals using the clock signal and a divisor, wherein a frequency of a given one of the plurality of divider output signals is a fractional quotient of a frequency of the clock signal;
a cancelation circuit configured to generate a feedback signal using a particular divider output signal, wherein a delay between the particular divider output signal and the feedback signal is based on an accumulated phase residue generated by the divider circuit; and
a comparator circuit configured to compare a reference signal to the feedback signal to generate a control signal; and
wherein the oscillator circuit is further configured to adjust the frequency of the clock signal using the control signal.

16. The apparatus of claim 15, wherein the cancelation circuit is further configured to quantize the accumulated phase residue into an integer portion and a fractional portion.

17. The apparatus of claim 16, wherein the cancelation circuit is further configured to:
   select the particular divider output signal of the plurality of divider output signals using the integer portion; and
   delay, based on the fractional portion, the particular divider output signal to generate the feedback signal.

18. The apparatus of claim 17, wherein the cancelation circuit includes an adjustable delay circuit configured to delay the particular divider output signal to generate the feedback signal, and wherein the cancelation circuit is further configured to:
   track environmental changes of the adjustable delay circuit; and
   adjust an operational parameter of the adjustable delay circuit based on the environmental changes.

19. The apparatus of claim 18, wherein the cancelation circuit is further configured to characterize the adjustable delay circuit to generate characterization data, and wherein the voltage regulator circuit is further configured to adjust the voltage level of the regulated power supply node based on the characterization data.

20. The apparatus of claim 18, wherein a delay between a first divider output signal of the plurality of divider output signals and a second divider output signal of the plurality of divider output signals corresponds to a unit interval associated with the reference signal.

* * * * *